(12) United States Patent
Bot et al.

(10) Patent No.: US 10,726,176 B1
(45) Date of Patent: Jul. 28, 2020

(54) METHOD AND APPARATUS FOR DESIGNING ELECTRICAL AND ELECTRONIC CIRCUITS

(71) Applicant: BQR Reliability Engineering Ltd., Rishon-Lezion (IL)

(72) Inventors: Yizhak Bot, Rishon-Lezion (IL); Alex Gonorovsky, Rishon-Lezion (IL); Isaac Rosenstein, Rishon-Lezion (IL)

(73) Assignee: BQR RELIABILITY ENGINEERING LTD., Rishon-Lezion (IL)

( * ) Notice: Subject to any disclaimer, the term of this patent is extended or adjusted under 35 U.S.C. 154(b) by 0 days.

(21) Appl. No.: 16/412,954

(22) Filed: May 15, 2019

(51) Int. Cl.
*G06F 30/327* (2020.01)
(52) U.S. Cl.
CPC ................... *G06F 30/327* (2020.01)
(58) Field of Classification Search
USPC ........................................................ 716/103
See application file for complete search history.

(56) References Cited

U.S. PATENT DOCUMENTS

| | | |
|---|---|---|
| 6,556,991 B1 | 4/2003 | Borkovsky |
| 6,754,321 B1 | 6/2004 | Innes et al. |
| 6,763,516 B2 | 7/2004 | Fujikawa |
| 6,765,612 B1 | 7/2004 | Anderson et al. |
| 7,536,377 B1 | 5/2009 | Milne et al. |
| 9,652,522 B2 | 5/2017 | Haren et al. |
| 2003/0212980 A1* | 11/2003 | Frank ................ G06Q 40/00 716/113 |
| 2010/0131925 A1 | 5/2010 | Gutfleisch |
| 2016/0381726 A1 | 12/2016 | O Donnabhain |

\* cited by examiner

*Primary Examiner* — Bryce M Aisaka
(74) *Attorney, Agent, or Firm* — The Roy Gross Law Firm, LLC; Roy Gross

(57) ABSTRACT

A method, system and computer program product, the method comprising: obtaining circuit information of at least a portion of a circuit design, the circuit information specifying a plurality of components and a plurality of nets, each of the plurality of nets connecting components from the plurality of components; receiving a multiplicity of design properties for a net selected from the plurality of nets; receiving text indicative of a value for parameter of the net or a predetermined field associated with the net; generating a character string indicative of a design property of the design properties and the value, the character string being in compliance with a naming scheme; and associating the character string with the net as a value of a net name property.

18 Claims, 4 Drawing Sheets

METHOD AND APPARATUS FOR DESIGNING ELECTRICAL AND ELECTRONIC CIRCUITS

TECHNICAL FIELD

The present disclosure relates to designing electronic circuits in general, and to a method and apparatus for assisting a designer of a circuit, in particular.

BACKGROUND

In order to start the design of a circuit, a specification needs to be received, which states the functionality that the finished design needs to provide. However, the specification does not indicate how this functionality is to be achieved. The specification is essentially a technical description of what the finished circuit has to achieve, and can include a variety of electrical requirements, such as the input and output signals of the circuit, the available power supplies, permitted power consumption, or the like. The specification can also set some physical parameters that the design must meet, such as size, weight, moisture resistance, temperature range, thermal output, vibration tolerance, acceleration tolerance, or the like.

The design process includes transforming the specification into a plan that contains all the information required for physically constructing the circuit. The process normally includes several stages.

First, the specification is converted into a block diagram of the various functions that the circuit must perform, at which stage the contents of each block are not considered, but only what the block does. This approach allows for breaking a possibly complicated task into smaller tasks which may be handled one after the other, or divided amongst members of a design team.

Each block may then be studied in more detail, and in particular the details of the electrical functions of the block are considered.

Then, the specific circuit components are chosen to carry out each function of the overall design. At this stage the physical layout and electrical connections of each component are also determined. This stage is usually done using a graphic user interface, in which the layout of the circuit is designed. Each element may have a name property, and during design, each element of the design may be assigned value for the name property, wherein the name property value comprises a character string. The value of the name property may be used for identifying the element, searching, or the like. The value of the name property may be assigned by the designer according to his or her choice. A default value may be assigned automatically to each unnamed element by the design software.

The resulting layout may be used for the production of a printed circuit board or Integrated circuit.

BRIEF SUMMARY

One exemplary embodiment of the disclosed subject matter is a computer-implemented method comprising: obtaining circuit information of at least a portion of a circuit design, the circuit information specifying a plurality of components and a plurality of nets, each of the plurality of nets connecting components from the plurality of components; receiving one or more design properties for a net selected from the plurality of nets; receiving text indicative of a value for parameter of the net or a predetermined field associated with the net; generating a character string indicative of a design property of the design properties and the value, the character string being in compliance with a naming scheme; and associating the character string with the net as a value of a net name property. The method can further comprise displaying the character string in proximity to an indication of the net in a circuit design software. Within the method, the character string optionally comprises an indication to the naming scheme. The method can further comprise parsing the net name property for retrieving the at least one design property and the value for the parameter or the predetermined field. Within the method, parsing is optionally performed as part of verification of the circuit design. Within the method, the design properties are optionally arranged as at least one hierarchy. Within the method, the design properties optionally include a class of the net. Within the method, the design properties optionally include a subclass of the net. Within the method, the design properties optionally include a type of the net. Within the method, the design properties optionally include a tail of the net. Within the method, the parameter of the net is optionally electrical voltage of the net. Within the method, the parameter of the net is optionally electrical current of the net. Within the method, the parameter of the net is optionally electrical frequency of the net. Within the method, the parameter of the net is optionally electrical power of the net. Within the method, the parameter of the net is optionally electrical ratio in logarithmic form of the net. Within the method, the predetermined field is optionally a prefix of a net name. Within the method, the predetermined field is optionally a comment related to the net.

Another exemplary embodiment of the disclosed subject matter is an apparatus having a processor, the processor being adapted to perform the steps of: obtaining circuit information of at least a portion of a circuit design, the circuit information specifying a plurality of components and a plurality of nets, each of the plurality of nets connecting components from the plurality of components; receiving one or more design properties for a net selected from the plurality of nets; receiving text indicative of a value for parameter of the net or a predetermined field associated with the net; generating a character string indicative of a design property of the design properties and the value, the character string being in compliance with a naming scheme; and associating the character string with the net as a value of a net name property.

Yet another exemplary embodiment of the disclosed subject matter is a computer program product comprising a non-transitory computer readable medium retaining program instructions, which instructions when read by a processor, cause the processor to perform a method comprising: obtaining circuit information of at least a portion of a circuit design, the circuit information specifying a plurality of components and a plurality of nets, each of the plurality of nets connecting components from the plurality of components; receiving one or more design properties for a net selected from the plurality of nets; receiving text indicative of a value for parameter of the net or a predetermined field associated with the net; generating a character string indicative of a design property of the design properties and the value, the character string being in compliance with a naming scheme; and associating the character string with the net as a value of a net name property.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings.

DETAILED DESCRIPTION

Figure 1:
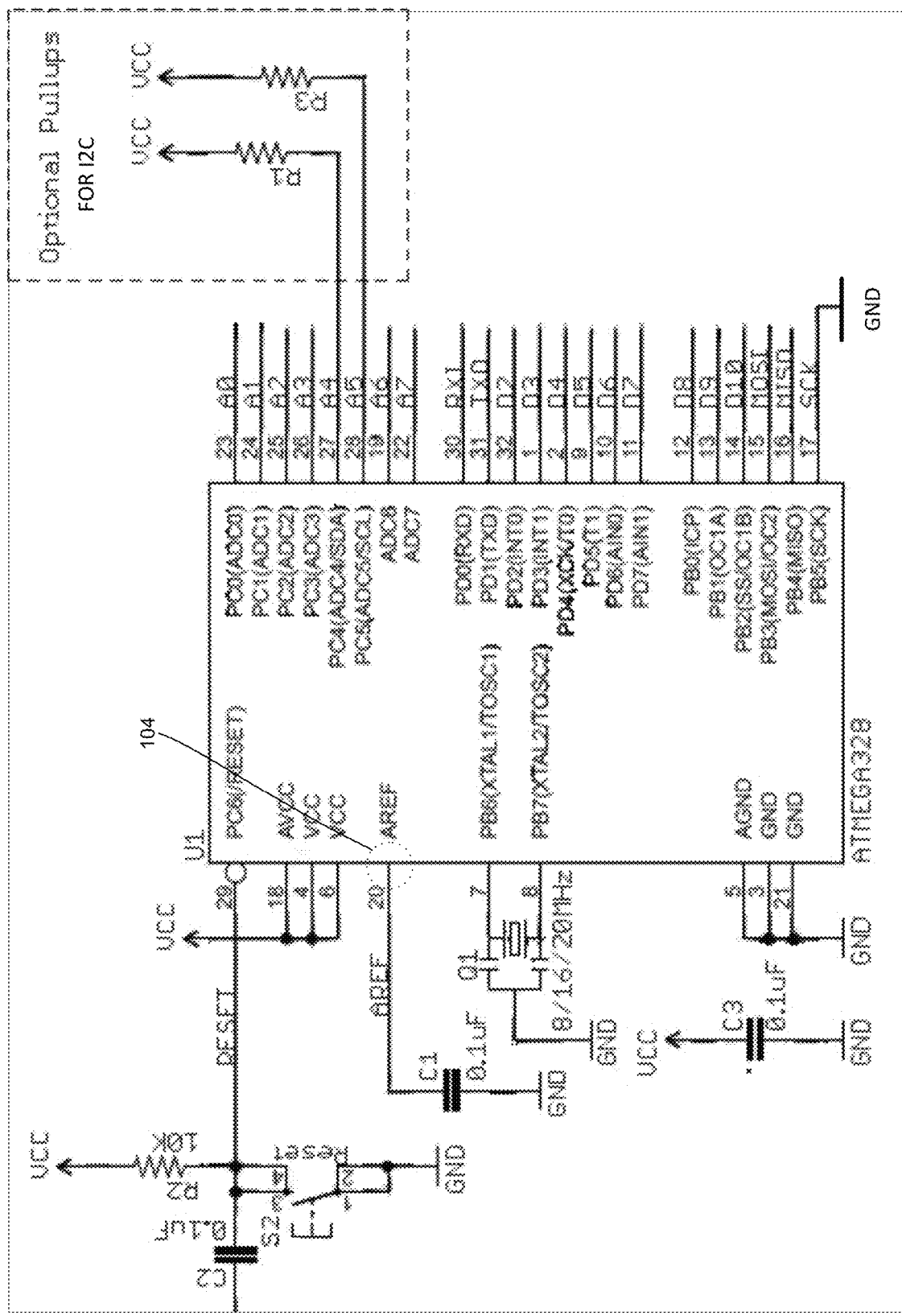
FIG. 1 shows an exemplary electronic circuit.

The term "Net" used in this specification should be expansively construed to cover any kind of Net, i.e., a node connecting one or more elements in an electronic circuit.

Each net in a circuit has a name property, which is typically assigned a string character as a value. In the disclosure below and unless stated otherwise, the terms "name", "value", "string character", "property", "net name" and "net name property" are used interchangeably to indicate a string character assigned as a value for the name property of a net.

One technical problem dealt with by the disclosed subject matter is the need to assign names at least some of the elements, and in particular nets, in an electronic design by meaningful names. Currently, Computer Aided Design (CAD) systems, with which designers design circuits, automatically assign default names as name net property in a design. For example, the names may be created using a constant prefix and an advancing counter, for example N0001, N0002, etc.

However, these names carry no meaningful information. Although a user can rename a net name property to any desired value, users are unlikely to provide a name that carries significant amount of information, and at most provide some general identification of the net. Considering the significant role of nets in an electrical circuit, the lack of meaningful names makes understanding the role of a net or the functionality of the circuit by another person, or by the designer at a later time, much harder than it could be given a significant name that provides information about the characteristics or role of the net.

One technical solution provided by the disclosure is a method and apparatus for assigning or reassigning values to net names property, such that a user can easily assign meaningful names that carry substantial information about the net. In some embodiments, a net can be selected graphically or in any other manner from a design. Upon selection, a user interface may be displayed which enables a user to select or enter various characteristics of the net, and a suggested name may be generated based on the characteristics. In some embodiments, the user can also indicate or select specific electronic or other details of the net, which are also embedded into the value of the net name property. In some embodiments, the user can further add free text which may also be embedded within the value.

In some embodiments, the characteristics and details of the net which the user can select or input text for, depend on a specific naming scheme used. For example, different versions of naming schemes may be developed, different schemes can be used for different types of circuits, different schemes can be used by different organizations, or the like. The specific scheme version may thus be also embedded or otherwise indicated within the name.

One technical effect of the disclosure relates to a method and apparatus for easily generating meaningful values to be used as net name properties, such that a user reviewing or otherwise relating to the circuit can easily grasp the physical or electronic meaning of a net in a circuit design.

Another technical effect of the disclosure relates to the generated value being of a predetermined scheme or format which is known. The scheme may be either fixed, or embedded within the value. The value can thus be parsed, according to the fixed or retrievable scheme, such that that the relevant net information can be automatically retrieved from the value and used in any manner, including during further design operations, and in particular during various automatic verification stages.

Referring now to FIG. 1, showing an exemplary electrical circuit, which contains one or more nets, such as net 104, for which it is required to generate a meaningful value for a net name property. Once a value for a net name property name is generated or changed, the updated value may appear on the visual representation of the circuit in proximity to the net. A user may select the net by pressing a button, making a selection from a menu or performing any other action, and then a user interface for generating a value for the net name property may be displayed. Additionally or alternatively, the user may access the user interface without any net being selected, in which case a list of all nets may be displayed, from which the user can select and edit one or more nets.

Figure 2:
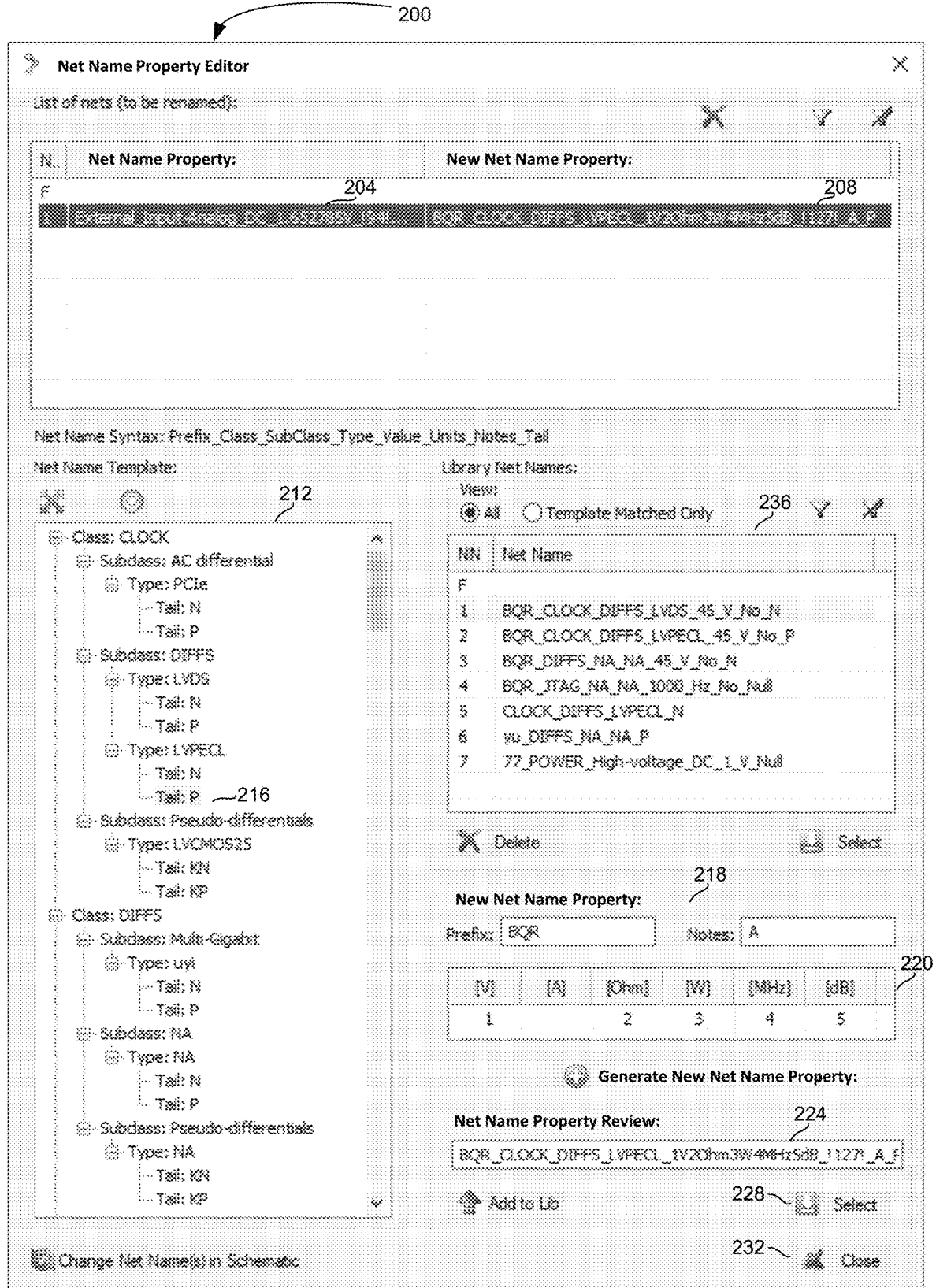
FIG. 2 shows a user interface for generating a value for a net name property for a net, in accordance with some exemplary embodiments of the disclosed subject matter.

Referring now to FIG. 2, showing a user interface 200 for generating a value for a net name property for a net, in accordance with the disclosure. It will be appreciated that the user interface is exemplary only and that multiple other manners of displaying and editing the information may be designed.

User interface 200 may comprise pane 204, for displaying a list of values of the name property of existing nets, and pane 208 for displaying new values generated for the nets name property. The user can select any name on the list, and continue editing the name.

User interface 200 may comprise hierarchy 208, displaying the hierarchy of all classes, subclasses, types and tails available for the nets. It will be appreciated that other or additional hierarchies, comprising other levels applicable for nets may be designed and displayed for a user to select from. By selecting an item which is at the lowest level in the hierarchy, for example item 216 indicating a tail, the higher levels are selected automatically, being class, subclass and type.

User interface 200 may comprise pane 218, in which a user can enter a prefix for the net name property, and notes. In some embodiments, the user may also enter any free text.

User interface 200 may comprise pane 220, for entering values for predetermined physical or electrical properties characterizing for a net, such as electrical voltage, electrical power, electrical current, electrical frequency, electrical ratio, or others.

The information derived from hierarchy pane 212, prefix and notes pane 218 and properties pane 220 may be arranged as a string 224, which is a suggested value for the name property of the net, the string conveying the net role, functionality, properties, or the like. It will be appreciated that string 224 is not fully displayed in FIG. 2 due to space limitations, but rather contains additional characters that are not shown, such as characters indicating that the net has a "P" tail.

String 224 may also comprise an indication to the version of the scheme upon which the string was generated. Using this indication, the value of a net name property may be parsed to automatically obtain the relevant parameters, for purposes such as but not limited to automatic verification.

Once the user hits Select button 228, the value of the net name property may be updated in pane 208.

Once the user hits Close button 232, the user interface may close and all updated values may be saved and displayed on the circuit, such as the circuit shown on FIG. 1.

User interface 200 may also comprise a pane 236 of stored values of net name property, from which the user may select an existing name for a name property of a current net the user is generating a value for. In some embodiments, the value of the net name property may be parsed, its components retrieved and displayed as selection in hierarchy pane 212 or values on properties pane 220, after which the user may update the selection or any of the values.

Figure 3:
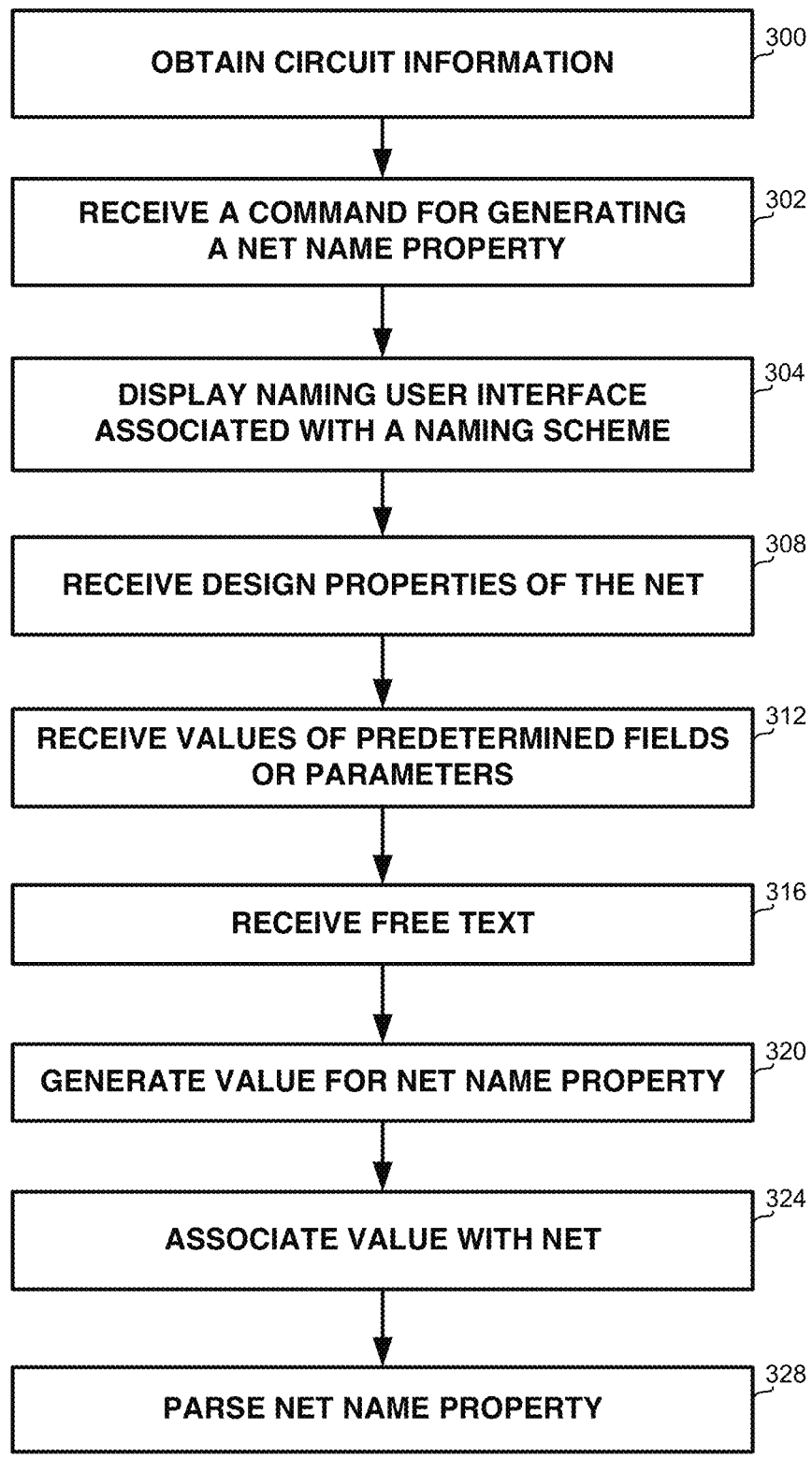
FIG. 3 shows a flowchart of a method for generating a value for a net name property for a net, in accordance with some exemplary embodiments of the disclosed subject matter.

Referring now to FIG. 3, showing a flowchart of a method for generating a value for a net name property for a net, in accordance with the disclosure.

On step 300, circuit information of at least a portion of an electric or electronic circuit may be received. The circuit information may comprise a plurality of components and a plurality of nets, wherein each net connects one or more components from the plurality of components.

On step 302, a command to generate a net name property may be received. The command may be received with or without an association to a specific net. The command may be received by the user making a selection form a menu, hitting a button, or the like.

On step 304, a naming user interface may be displayed, for example the user interface shown on FIG. 2. The user interface may be associated with a naming scheme, such that names generated with the user interface are compliant with the naming scheme.

On step 308, design properties of the net may be received. The design properties may be received from the user, for example as a selection within a hierarchy describing nets, indicating for example the class, subclass, type and tail of a net.

On step 312, values such as text values may be received for predetermined parameters, such as electrical voltage, electrical power, electrical current, electrical frequency, electrical ratio (optionally in logarithmic form), etc.

On step 316, free text values may be received for additional predetermined fields such as prefix or notes.

On step 320, a value comprising a character string may be generated, which may include data from the fields that have been provided by the user, including any one or more of the following: hierarchy selection prefix, notes, location in hierarchy, and physical or electrical parameters. The generated string may have a predetermined separator between consecutive items, such as a space, an underscore, or the like. The generated string may also reflect a version of the naming scheme, which enables the retrieval of the string components.

On step 324, the value may be stored or associated with the net as a value of the net name property, such that when the net is referred to, for example displayed or selected for further renaming, parsed, or the like, the string is retrieved and/or displayed.

On step 328, the value of the net name property may be parsed, and its components may be retrieved. Parsing and retrieval may be performed by an automatic verification tool, upon further update of the net name property, or the like. Parsing may utilize the naming scheme version which may be fixed or as embedded within the character string, in order to select the correct parsing scheme if multiple schemes are available.

Figure 4:
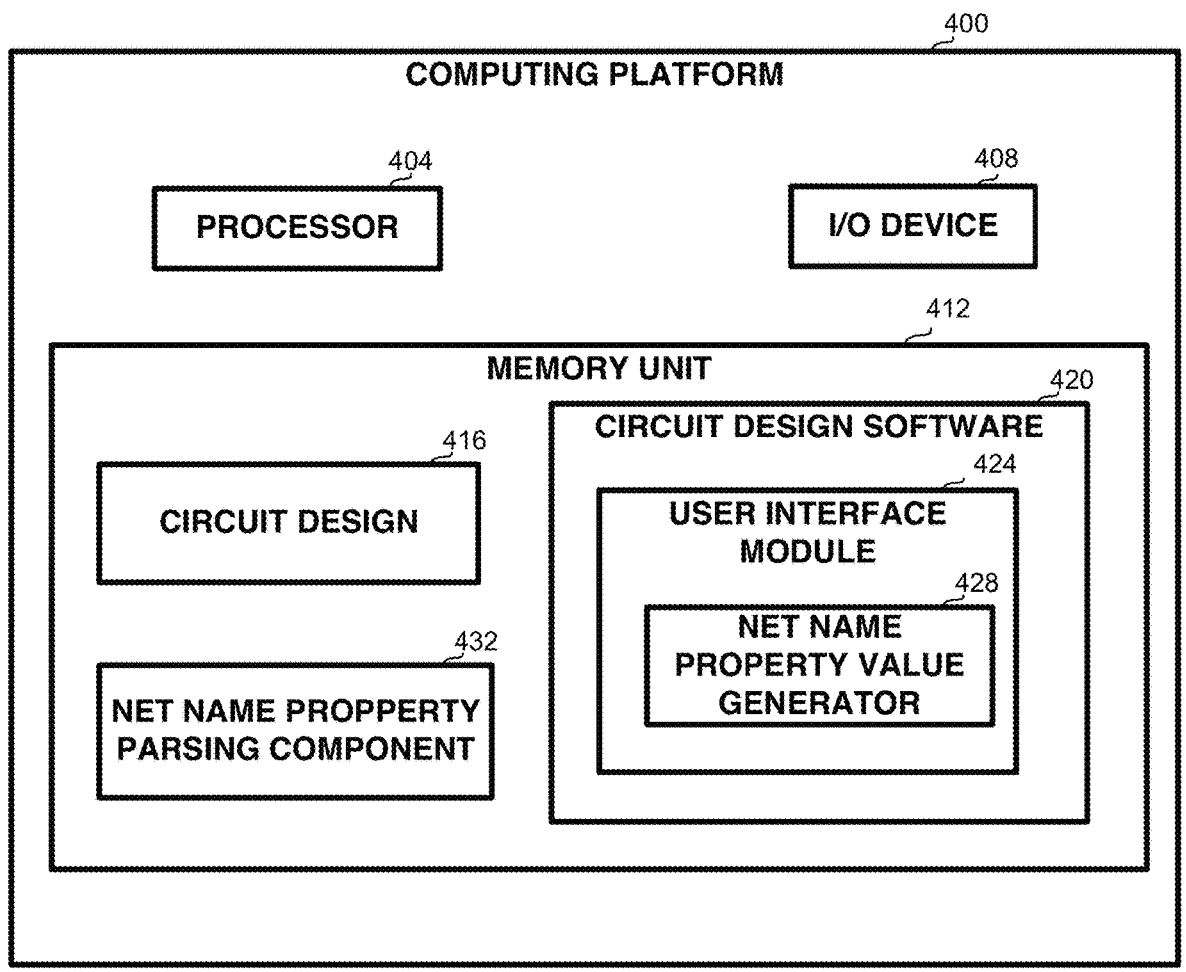
FIG. 4 shows a block diagram of a computing device configured for generating values for nets name property, in accordance with some exemplary embodiments of the disclosed subject matter.

Referring now to FIG. 4, showing a block diagram of a computing platform 400 for generating values for nets name property, in accordance with some exemplary embodiments of the disclosed subject matter.

In some exemplary embodiments computing platform 400 may comprise a processor 404, which may be a Central Processing Unit (CPU), a microprocessor, an electronic circuit, an Integrated Circuit (IC) or the like. Processor 404 may be utilized to perform computations required by computing platform 400 or any of it subcomponents. Processor 404 may be configured to execute computer-programs useful in performing the method of FIG. 3.

In some exemplary embodiments, one or more I/O devices 408 may be configured to receive input from and provide output to a user. In some exemplary embodiments, I/O devices 408 may be utilized to present to the user a user interface, obtain user input instructions useful for generating a value for a net name property, and display the value. I/O devices 408 may comprise a keyboard, a mouse, a touch screen or another tracking device, a voice activated device, or the like.

In some exemplary embodiments computing platform 400 may comprise a memory unit 412. Memory unit 412 may be a short-term storage device or long-term storage device. Memory unit 412 may be a persistent storage or volatile storage. Memory unit 412 may be a disk drive, a Flash disk, a Random Access Memory (RAM), a memory chip, or the like. Memory unit 412 may be a single memory device, or multiple interconnected memory devices which may be co-located or located in different locations and communicating via any communication channel.

In some exemplary embodiments, memory unit 412 may retain program code operative to cause processor 404 to perform acts associated with any of the subcomponents of computing platform 400. In some exemplary embodiments, memory unit 412 may retain program code operative to cause processor 404 to perform acts associated with any of the steps shown in FIG. 3 above.

Memory unit 412 may retain circuit design 416 for one or more circuits. The circuit design may have been created using circuit design software 420, imported from another storage device, or otherwise received. Circuit design 416 may also be stored on a memory unit or a database associated with another computing platform, which is in communication with computing platform 400.

The components detailed below may be implemented as one or more sets of interrelated computer instructions, executed for example by processor 404 or by another processor. The components may be arranged as one or more executable files, dynamic libraries, static libraries, methods, functions, services, or the like, programmed in any programming language and under any computing environment.

Memory unit 412 may retain circuit design software 420, such as any CAD software, designed for editing circuits. In addition to all conventional components of any CAD software, circuit design software 420 may comprise a user interface module 424, configured to display a user interface, such as the user interface shown on FIG. 2.

User interface module 424 may comprise net name property value generator 428 designed to generate a string upon user selections and other information provided by the user, the string to be used as a value for the net name property.

Memory unit 412 may retain net name property parsing component 432, for receiving a value which may have been generated by net name property value generator 428, and parse it to obtain the various user selections and parameter values embedded therein. Net name property parsing component 432 can be used by user interface module 424, by a verification engine, or the like.

It will be appreciated that the method and apparatus can also be used for assigning values to the name property of other components, such that a user can select certain characteristics and/or enter text describing values for other one or more characteristics. A value can then be generated for the component using the selected or entered values in accordance with a predetermined scheme.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
    obtaining circuit information of at least a portion of a circuit design, the circuit information specifying a plurality of components and a plurality of nets, each of the plurality of nets connecting components from the plurality of components;
    receiving at least one design property for a net selected from the plurality of nets, the at least one design property including a class of the net;
    receiving text indicative of a value for parameter of the net or a predetermined field associated with the net;
    generating a character string indicative of at least one design property of the design properties and the value, the character string being in compliance with a naming scheme; and
    associating the character string with the net as a value of a net name property.

2. The method of claim 1, further comprising displaying the character string in proximity to an indication of the net in a circuit design software.

3. The method of claim 1, wherein the character string comprises an indication to the naming scheme.

4. The method of claim 1, further comprising parsing the net name property for retrieving the at least one design property and the value for the parameter or the predetermined field.

5. The method of claim 4, wherein parsing is performed as part of verification of the circuit design.

6. The method of claim 1, wherein the at least one design property is arranged as at least one hierarchy.

7. The method of claim 1, wherein the at least one design property includes a subclass of the net.

8. The method of claim 1, wherein the at least one design property includes a type of the net.

9. The method of claim 1, wherein the at least one design property includes a tail of the net.

10. The method of claim 1, wherein the parameter of the net is electrical voltage of the net.

11. The method of claim 1, wherein the parameter of the net is electrical current of the net.

12. The method of claim 1, wherein the parameter of the net is electrical frequency of the net.

13. The method of claim 1, wherein the parameter of the net is electrical power of the net.

14. The method of claim 1, wherein the parameter of the net is electrical ratio in logarithmic form of the net.

15. The method of claim 1, wherein the predetermined field is prefix of a net name.

16. The method of claim 1, wherein the predetermined field is a comment related to the net.

17. An apparatus having a processor, the processor being adapted to perform the steps of:
    obtaining circuit information of at least a portion of a circuit design, the circuit information specifying a plurality of components and a plurality of nets, each of the plurality of nets connecting components from the plurality of components;
    receiving a multiplicity of design properties for a net selected from the plurality of nets, the multiplicity of design properties including a class of the net;
    receiving text indicative of a value for parameter of the net or a predetermined field associated with the net;
    generating a character string indicative of at least one design property of the design properties and the value, the character string being in compliance with a naming scheme; and
    associating the character string with the net as a as a value of a net name property.

18. A computer program product comprising a non-transitory computer readable medium retaining program instructions, which instructions when read by a processor, cause the processor to perform a method comprising:
    obtaining circuit information of at least a portion of a circuit design, the circuit information specifying a plurality of components and a plurality of nets, each of the plurality of nets connecting components from the plurality of components;
    receiving a multiplicity of design properties for a net selected from the plurality of nets, the multiplicity of design properties including a class of the net;
    receiving text indicative of a value for parameter of the net or a predetermined field associated with the net;
    generating a character string indicative of at least one design property of the design properties and the value, the character string being in compliance with a naming scheme; and
    associating the character string with the net as a value of a net name property.

* * * * *